United States Patent [19]

Teng et al.

[11] Patent Number: 4,958,212

[45] Date of Patent: Sep. 18, 1990

[54] TRENCH MEMORY CELL

[75] Inventors: Clarence W. Teng, Plano; William F. Richardson, Richardson; Robert R. Doering, Plano; Ashwin H. Shah, Dallas; Bing W. Shen, Richardson, all of Tex.; Mark Bordelon, Melbourne Beach, Fla.

[73] Assignee: Texas Instruments Incorporated, Dallas, Tex.

[21] Appl. No.: 292,285

[22] Filed: Dec. 30, 1988

[51] Int. Cl.$^5$ ............... H01L 29/34; H01L 27/04; H01L 29/78

[52] U.S. Cl. .............................. 357/54; 357/52; 357/48; 357/23.6

[58] Field of Search ............ 437/48; 357/23.6, 23.4, 357/54, 55, 42, 49, 40; 365/149, 51, 189

[56] References Cited

U.S. PATENT DOCUMENTS 4,721,987  1/1988  Baglee et al. ............... 357/23.6
4,830,978  5/1989  Teng et al. .................. 357/23 X

FOREIGN PATENT DOCUMENTS 52-126570  9/1978  Japan ............ 357/51
5592773    1/1982  Japan ............ 357/51
57-80387  11/1983  Japan ............ 357/51

Primary Examiner—Rolf Hille
Assistant Examiner—Fetsum Abraham
Attorney, Agent, or Firm—James C. Kesterson; James T. Comfort; Melvin Sharp

[57] ABSTRACT

An improved memory cell layout (54) is formed including a trench cell (60) formed in a semiconductor substrate (58). The memory cell layout (54) includes a bitline (56) and a wordline (62) for storing and accessing charge. The charge is stored on a capacitor formed from a conductor (68), an insulating region (70) and a semiconductor substrate (58). Bitline (56) is primarily tangential to a trench cell (60), or may surround the periphery thereof. A wordline (62) overlies trench cell (60) and extends therein, and further may be formed of a width narrower than trench cell (60).

14 Claims, 2 Drawing Sheets

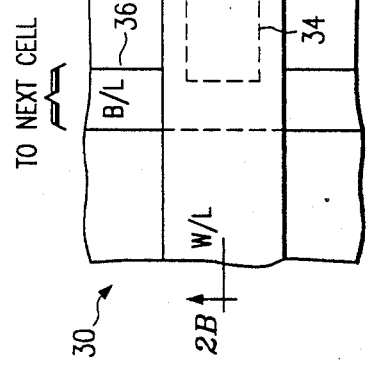
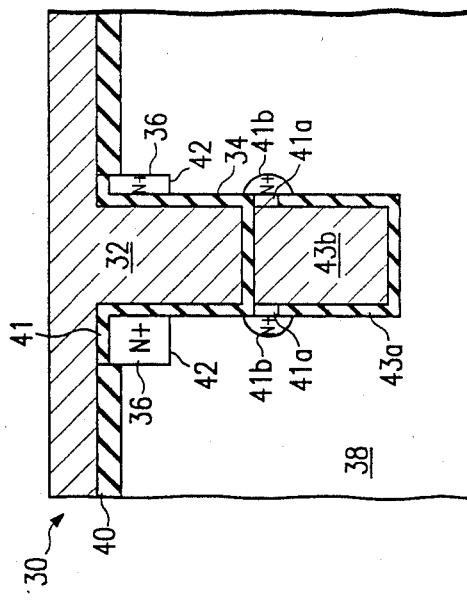
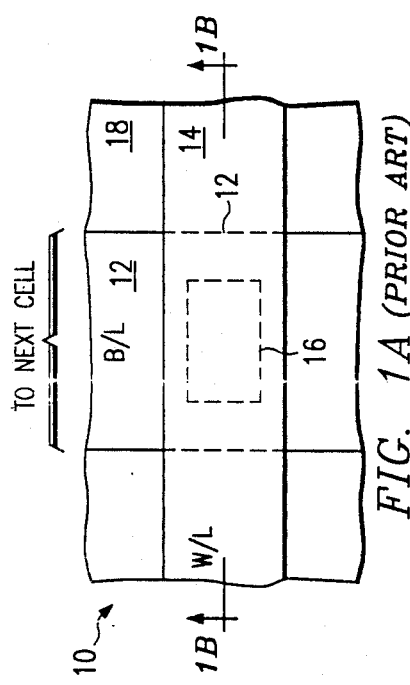
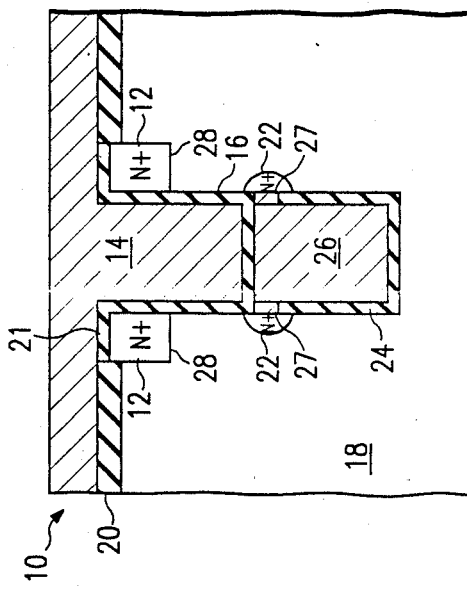
FIG. 2A
FIG. 2B
FIG. 1A (PRIOR ART)
FIG. 1B (PRIOR ART)

TRENCH MEMORY CELL

TECHNICAL FIELD OF THE INVENTION

This invention relates to memory cell design, and more particularly to an improved trench transistor cell array design and the construction thereof.

BACKGROUND OF THE INVENTION

The proliferation of the use of microprocessors in technology has brought with it the need for larger and improved memory packages. More particularly, there is a constant need to increase the density of dynamic random access memories (DRAMs). Memory packages have increased in density from two kilobits of memory cells to present day requirements of over four megabits of memory cells. In designing the DRAM, there are four major priorities. These priorities are: (1) packaging, (2) speed, (3) power, and (4) reliability. With the need for four megabit DRAM cells, these four priorities must be accommodated.

Memory architectures are optimized with respect to all four of these priorities. Efficient layouts and architectures generally dictate that the memory cell dimensions are greater in the direction of the wordline than in the direction of the bitline. The speed associated with the memory cells is directly related to the resistance and capacitance thereof. Any action that reduces the resistance times capacitance product of either the bitline or wordline will improve speed. Similarly, the power associated with the memory cells is related to the capacitance and the speed of operation. Further, increases in capacitance raise delay times associated with the memory cells and therefore diminish the speed of the cell while raising the power requirements therefor.

Incorporation of trenches is a proven technique for improving the density of DRAM memory cells. The practice of total containment of the trench opening within the dimensions of the bitline and wordline prevents the use of minimum width, (i.e. minimum capacitance) bitlines and wordlines. Therefore, a need has arisen for an improved memory cell which accomodates architectural constraints while minimizing capacitances associated with the cell in order to provide a high speed, low power DRAM for a multitude of typical applications.

SUMMARY OF THE INVENTION

In accordance with the present invention, an improved trench memory cell is provided which substantially eliminates or reduces disadvantages and problems associated with prior trench memory cells.

The present invention includes a semiconductor substrate having a trench formed therein. A conductor overlies the trench and partially extends therein. A conductive region is primarily tangential to the trench. More particularly, the conductive region may entirely, or partially, surround the periphery of the trench. Further, the width of the overlying conductor may be reduced to an extent narrower than the trench. The conductor is typically used as a wordline for the memory cell, while the conductive region may be used as a bitline therefor.

The present invention includes the technical advantage of reducing capacitances associated with the memory cell. More particularly, both bitline and wordline capacitances are reduced. The reduction in capacitances provides the further technical advantage of increasing the speed of the memory cell; that is, both the speed at which the trench capacitor is charged and the access speed of the memory cell are increased. Further, the present invention provides the technical advantage of a reduced power requirement for operation of the memory cell.

BRIEF DESCRIPTION OF THE DRAWINGS

For a more complete understanding of the present invention and for further advantages thereof, reference is now made to the following Detailed Description, taken in conjunction with the accompanying drawings, in which:

FIG. 1a illustrates a prior art trench transistor cell layout;

FIG. 1b illustrates a cross-sectional view of the prior art cell layout illustrated in FIG. 1a along line B—B';

FIG. 2a illustrates a top plan view of a first embodiment of a trench transistor cell layout of the present invention;

FIG. 2b illustrates a cross-sectional view of the cell layout illustrated in FIG. 2a along line B—B';

DETAILED DESCRIPTION OF THE INVENTION

Figure 4B:
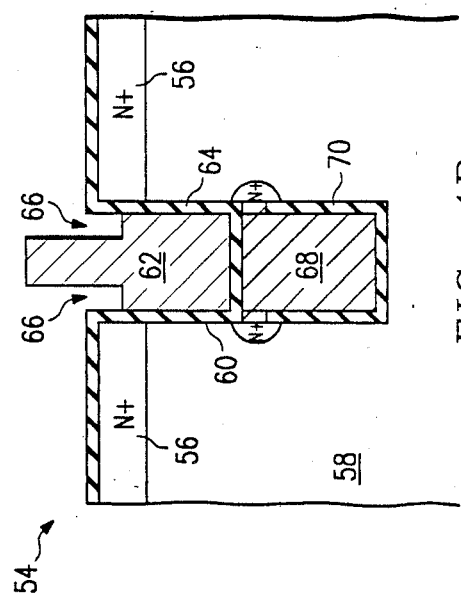
FIG. 4b illustrates a cross-sectional view of the trench transistor cell layout illustrated in FIG. 4a along line B—B'.

FIG. 1a illustrates a prior art trench transistor cell layout 10. Typically, a plurality of cell layouts 10 are aligned in a row by column array. Layout 10 includes a bitline 12, a wordline 14 and a trench transistor/capacitor cell 16. The prior art layout 10 is dimensioned in order to accommodate the layout constraints of the control circuitry that selects the desired memory location within the array. Typically, for minimum feature size of 1.0μm, bitline 12 is 2.5μm in width, while wordline 14 is 1.7μm in width. In order to contain a minimum dimension trench, wordline 14 is wider than minimum dimension. In order to maintain the storage capacitance of cell 16 with a minimum width, the length of cell 16 may be increased.

The prior art layout 10 uses bitline 12 at a width greater than the length of cell 16, and further maintains bitline 12 in a contiguous rectangular fashion throughout the entire plurality of cells 16. As a result, an increase in the length of cell 16 increases the width of bitline 12. Increasing the width of bitline 12 has the effect of increasing bitline capacitance, which increases power consumption, thereby diminishing the efficiency of cell layout 10.

FIG. 1b illustrates a cross-sectional view of cell layout 10 illustrated in FIG. 1a along the line B—B'. From this perspective, it may be seen that trench cell 16 is a well-shaped structure formed within a semiconductor substrate 18. Typically, trench cell 16 is formed by an etch into semiconductor substrate 18. Wordline 14 overlies trench cell 16 and extends partially within trench cell 16. Wordline 14 commonly comprises a conductor, typically created by doping a patterned polysilicon layer over cell layout 10. Bitline 12 is typically a diffused region which intersects and surrounds the periphery of trench cell 16.

Bitline 12 may be formed by a masking process in which a photoresist mask is formed over the cell array. The exposed surface is implanted with a suitable dopant, such as arsenic or phosphorus. Standard doping levels are on the order of $10^{19}/cm^3$. An insulating region 20 exists between wordline 14 and semiconductor substrate 18. An insulating region 21 separates wordline 14 from bitline 12, and further extends within trench cell 16. Insulating region 21 is commonly narrower than insulating region 20.

A pass gate drain region 22 is disposed within substrate 18 and around the periphery of trench 16. A second insulating region 24 exists within a lower portion of trench cell 16. Typically, insulating regions 20, 21 and 24 comprise an oxide. An electrode 26 is formed within the lower area of trench cell 16. Usually, electrode 26 is formed by doping a semiconductor material within the lower area of trench cell 16. Sidewall plugs 27 are formed in second insulating region 24, allowing the dopants from electrode 26 to slightly diffuse into semiconductor substrate 18, thereby forming pass gate drain region 22. Hence, a vertical channel field-effect transistor is formed between bitline 12 and drain region 22.

In operation of cell layout 10, an input signal is first applied to bitline 12. Thereafter, a signal is applied to wordline 14. The combination of bitline 12, insulating region 20 and pass gate drain region 22 forms a vertical transistor along trench cell 16. Wordline 14 acts as a gate to the vertical transistor, and with the signal applied thereto forms a channel region between bitline 12 and pass gate drain region 22. The channel region couples bitline 12 to electrode 26. The combination of electrode 26 and semiconductor substrate 18, having an insulating region 24 therebetween, creates a capacitor. As a result, this capacitor will store the charge conducted through the vertical transistor. The prior art cell layout 10 is discussed in further detail in U.S. Pat. Application No. 026,356, by C. Teng, et al., entitled "DRAM Cell/Method" and filed on Mar. 16, 1987.

The prior art layout has associated bitline and wordline capacitances. The existence of large capacitance lengthens the necessary time to charge and access the cell capacitor. Further, higher capacitance gives rise to higher power requirements for each cell within the array. The present invention provides for the reduction of cell capacitance, thereby reducing delay times and power requirements associated with the cell.

Bitline capacitance occurs as a result of the junction 28 which exists between bitline 12 and semiconductor substrate 18. Because junction 28 is a typical PN junction, there are the normal capacitances associated therewith. Hence, the larger the area of this junction, the larger the corresponding capacitance. It is therefore desirable to minimize the total area of junction 28 existing between bitline 12 and substrate 18. Accordingly, the present invention reduces the total area of bitline 12 thereby correspondingly reducing the amount of capacitance associated therewith.

Wordline capacitance occurs along insulating region 21 where it exists between wordline 14 and bitline 12. Thus, there are wordline capacitance effects in both the insulating region 21 overlying bitline 12, and further in insulating region 21 within trench 16 where wordline 14 is adjacent bitline 12. Wordline capacitance also arises from insulating region 20. This area contributes a proportionately smaller capacitance per unit of area because insulating region 20 is thicker than insulating region 21. The present invention described and claimed herein further reduces the area of high capacitance overlap and increases the area of low capacitance overlap, and therefore minimizes the corresponding capacitance.

FIG. 2a illustrates a top plan view of a first embodiment of a trench transistor cell layout 30 of the present invention. A wordline 32 completely overlies a trench cell 34. Wordline 32 comprises a conductor, typically formed by doping a patterned semiconductor layer overlying cell layout 30. Trench cell 34 is ordinarily formed by etching a hole into semiconductor substrate 38. The bitline 36 is also a conductor, and may comprise a diffused region formed within the substrate 38 and surrounding the periphery of trench cell 34, typically at the surface of substrate 38. Selective doping of semiconductor substrate 38 may be used to form bitline 36. Arsenic or phosphorus at a $10^{19}/cm^3$ concentration should adequately form bitline 36 by using common masking implantation techniques.

Unlike the prior art, the width of bitline 36 does not remain constant between successive memory cells 30, with each individual trench cell 34 being centered therein. Instead, bitline 36 remains substantially tangential to each trench cell 34. In other words, bitline 36 is constructed to pass substantially along an edge of trench cell 34, rather than being of uniform width and encompassing trench cell 16 as illustrated in FIG. 1a. Bitline 36 may be approximately 1.0μm in width in between successive trench cells 34. Further, bitline 36 extends to surround the perimeter of trench cell 34. As a result, the total bitline area is reduced in comparison to the contiguous rectangular bitline in the prior art.

FIG. 2b illustrates a cross-sectional view of cell layout 30 illustrated in FIG. 2a along line B—B'. Again, wordline 32 overlies trench cell 34 and extends therein. Bitline 36 is diffused within the substrate 38 and extends around the periphery of trench cell 34. An insulating region 40 exists between wordline 32 and semiconductor substrate 38. Insulating region 40 is on the order of 3000–5000 angstroms in thickness. An insulating region 41 separates wordline 32 from bitline 42, and further extends within trench cell 34. Insulating region 41 is typically 500 angstroms thick. Insulating regions 40 and 41 may comprise an oxide, or other dielectric materials such as a combination of oxide and nitride films. Sidewall plugs 41a are again formed to allow diffusion to pass gate drain regions 41b. As discussed in reference to FIG. 1b, pass gate drain regions 41b combine with bitline 36 to form a vertical transistor along trench cell 34. A junction 42 exists between substrate 38 and bitline 36. Since the total area of bitline 36 overlying the substrate has been reduced, there is a corresponding reduction in the area of junction 42. Because bitline capacitance correlates directly with the area of junction 42 and the area of overlap between wordline 32 and bitline 36, the reductions thereof further reduces bitline capacitance. Moreover, the reduction of bitline 36 also increases the amount of the thicker insulating region 40 between wordline 32 and semiconductor substrate 38. Further, the amount of the thinner insulating region 41 is also reduced. These changes in both insulating regions 40 and 41 act further to reduce device capacitance. Actual reduction in capacitance has been 30% in a particular construction of this embodiment.

Cell layout 30 includes the capacitor elements discussed in reference to FIG. 1a. These elements include an insulating region 43a disposed between an electrode 43b and semiconductor substrate 38.

Figure 3:
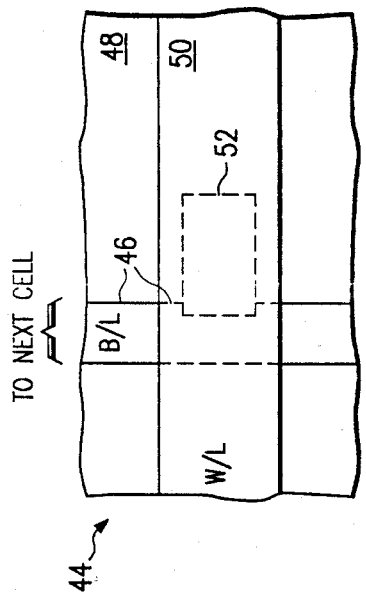
FIG. 3 illustrates a second embodiment of the trench transistor cell layout of the present invention.

FIG. 3 illustrates a second embodiment of trench transistor cell layout 44 of the present invention. Bitline 46 is again formed within substrate 48. Bitline 46 is formed in a manner similar as to that discussed with reference to FIGS. 2a-b. However, bitline 46 is narrowed such that it no longer surrounds the periphery of trench 52 as discussed in reference to FIG. 2b. Instead, bitline 46 is designed to remain primarily tangential to trench 52 without surrounding the periphery thereof. The wordline 50 has substantially the same structure illustrated in FIG. 2a. Therefore, the overlap between wordline 50 and bitline 46 is reduced, thereby reducing the capacitance between wordline 50 and bitline 46. Also, the area associated with the junction between bitline 46 and substrate 48 is further reduced and correspondingly reduces capacitance associated therewith. Actual reduction of capacitance for this embodiment approaches 100% less than the prior art.

Figure 4A:
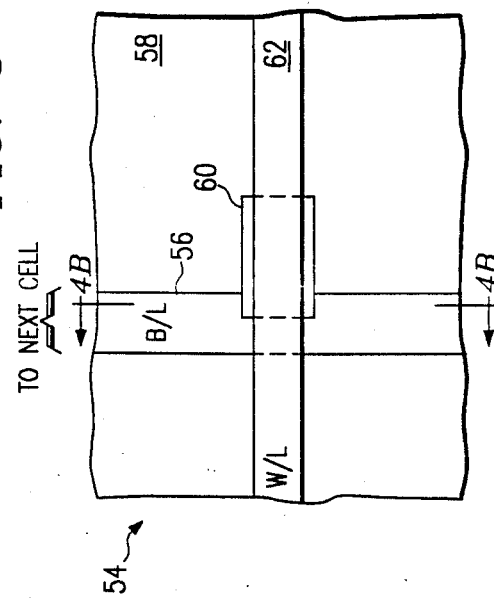
FIG. 4a illustrates a top plan view of the preferred trench transistor cell layout of the present invention.

FIG. 4a illustrates a top plan view of the preferred embodiment of the trench transistor cell layout 54 of the present invention. A bitline 56 is formed within substrate 58 and substantially tangential to trench cell 60. Again, bitline 56 is typically an N+ diffused region formed from an arsenic or phosphorous implantation. As discussed in reference to FIG. 3, bitline 56 only partially surrounds the periphery of trench cell 60. Within the preferred cell layout 56, wordline 62 is constructed of a width narrower than trench cell 60. Wordline 62 typically comprises a doped layer of patterned semiconductor material and may be formed approximately 1.0μm in width. Therefore, to form a narrower wordline 62, the mask associated with the process of forming the wordline 62 must be fashioned accordingly.

FIG. 4b illustrates a cross-sectional view of the preferred trench transistor cell layout 54 of FIG. 4a along line B-B'. From the perspective illustrated in FIG. 4b, it may be seen that wordline 62 is narrower than the width between insulating regions 64 within trench cell 60. This structure creates an additional gap 66 between wordline 62 and insulating region 64. An inner level insulator (not shown) may be typically formed over the surface of cell layout 54. With the formation of this insulating layer, gaps 66 will be filled with this dielectric material. Thus, the distance between bitline 56 and wordline 62 has been increased over the prior art and further filled with insulating (i.e. dielectric) material. As is known in the art, increasing the distance of dielectric material between two conducting plates decreases the capacitance therebetween. Further, because the overall area of wordline 62 is reduced, there is a smaller area of overlap between wordline 62 and bitline 56. Thus, the invention depicted in FIG. 4b further minimizes wordline to bitline capacitance by increasing the insulating region therebetween and also by decreasing the amount of overlap between wordline 62 and bitline 56.

Similar to the cell layout 10 illustrated in FIG. 1b, layout 54 includes a combination of elements within trench cell 60 to form a capacitor. A conductor 68 exists within trench cell 60, and is electrically isolated from substrate 58 by an insulating layer 70. As such, there are two conducting elements separated by a dielectric, thereby forming a capacitor for storing/accessing signals associated with cell layout 54.

The present invention thus reduces capacitance associated with prior trench cell layouts. The total area of bitline is reduced in comparison to prior structures. Further, the area of overlap between the wordline and bitline is reduced, while also being increasingly separated by a greater amount of dielectric material.

Although the present invention has been described in detail, it should be understood that various changes, substitutions and alterations can be made hereto without departing from the spirit and scope of the invention as defined by the appended claims.

What is claimed is:

1. A memory cell, comprising:
   a semiconductor substrate having a trench formed therein;
   a conductor overlying said trench and extending into said trench; and
   a conductive region including a linear portion extending primarily tangentially to but not overlapping said trench.

2. The memory cell of claim 1 wherein said conductor further extends within an upper periphery of said trench.

3. The memory cell of claim 1 wherein said conductive region comprises a diffused region.

4. The memory cell of claim 1 and further including an insulating region disposed between said conductive region and said conductor.

5. The memory cell of claim 1 wherein said conductive region further completely surrounds the periphery of said trench.

6. The memory cell of claim 1 wherein said conductive region further completely surrounds an upper periphery of said trench.

7. The memory cell of claim 1 wherein said conductive region partially surrounds the periphery of said trench.

8. The memory cell of claim 1 wherein said conductive region partially surrounds an upper periphery of said trench.

9. The memory cell of claim 1 wherein the width of said conductor is narrower than the width of said trench.

10. The memory cell of claim 1 wherein said conductive region comprises a bitline and said conductor comprises a wordline.

11. A memory cell having reduced capacitance comprising:
    a semiconductor substrate having a trench formed therein;
    a wordline overlying said trench and extending into said trench;
    a bitline having a linear portion disposed primarily tangential to but not overlapping said trench; and
    an insulating region disposed between said bitline and said wordline.

12. The memory cell of claim 11 wherein said bitline further partially surrounds the periphery of said trench.

13. The memory cell of claim 11 wherein said bitline further partially surrounds an upper periphery of said trench.

14. The memory cell of claim 11 wherein the width of said wordline is narrower than the width of said trench.

* * * * *